United States Patent

Kruszewski et al.

[15] 3,699,455

[45] Oct. 17, 1972

[54] AUTOMATIC FREQUENCY CONTROL CIRCUITRY FOR A VARACTOR TUNER SYSTEM

[72] Inventors: William Frank Kruszewski; Karol Siwko, both of Batavia, N.Y.

[73] Assignee: GTE Sylvania Incorporated

[22] Filed: Jan. 20, 1971

[21] Appl. No.: 108,033

[52] U.S. Cl. ..................325/423, 325/420, 325/422, 325/457, 334/15, 334/16

[51] Int. Cl. ..............................................H04b 1/16

[58] Field of Search ......325/346, 453, 457, 416–423; 331/1, 16, 36; 334/14, 15

[56] References Cited

UNITED STATES PATENTS

| | | | |
|---|---|---|---|
| 3,499,981 | 3/1970 | Neal et al. | 325/422 |
| 2,730,616 | 1/1956 | Bastow | 325/422 |
| 3,551,846 | 12/1970 | Hansen et al. | 334/15 |

*Primary Examiner*—Albert J. Mayer
*Attorney*—Norman J. O'Malley, Robert E. Walrath and Thomas H. Buffton

[57] ABSTRACT

In a signal receiver employing a varactor tuner responsive to alterations in a potential source for effecting signal selection, an automatic frequency control (AFC) system includes a discriminator coupled to the varactor tuner and having an amplifier coupled to an IF amplifier stage and by way of a bias means to the potential source. Adjustment of the potential source to effect variations in signal selection also causes variations in amplification by the discriminator system which, in turn, varies the AFC correction applied to the varactor tuner.

10 Claims, 3 Drawing Figures

INVENTORS
WILLIAM FRANK KRUZEWSKI &
KAROL SIWKO
BY
Robert E. Walrath
ATTORNEY

INVENTORS
WILLIAM FRANK KRUZEWSKI &
KARO L SIWKO
BY
Robert E. Walrath
ATTORNEY

AUTOMATIC FREQUENCY CONTROL CIRCUITRY FOR A VARACTOR TUNER SYSTEM

BACKGROUND OF THE INVENTION

Generally, signal receivers employ an automatic frequency control (AFC) system utilizing mixer and local oscillator stages to provide intermediate frequency (IF) signals for use with a discriminator. Deviations of these IF signals from a mean IF frequency are applied to a discriminator stage wherein a control or correction signal is developed and applied to the local oscillator stage. In turn, the local oscillator is shifted in frequency in response to the control signal in a manner such that the above-mentioned deviations of the IF signal from the mean IF frequency are virtually eliminated.

Usually, the above-described AFC systems have a "pull-in" range or system sensitivity of about 3 to 1 as the receiver tuning is varied across the TV bands (Channels 2–6,7–13 and 14–83). In other words, in a conventional or common AFC system that develops a constant correction signal independent of the receiver tuning when the receiver is detuned from the mean IF, the local oscillator's AFC circuitry has a characteristic that results in a correction or pull-in of a fine tuning error 3 times as great at the high frequency limit of tuning as the low frequency limit. While such conditions are not ideal, it has been found that the above-mentioned conditions are tolerable in present-day signal receiver construction and operation.

However, "pull-in" ranges in a ratio as great as 10:1 have been found in signal receivers employing the relatively new varactor or voltage alterable capacitance diode type tuners. For instance, it has been found that the local oscillator of a capacitance diode type tuner can be detuned about 3 mHz on channel 2 and a conventional AFC system will return the oscillator to within about 100 kc of the correct fine tuning point. On the other hand, the local oscillator can be detuned only about 0.3 mHz on channel 6 and returned to within about 100 kc of the correct fine tuning point with a conventional AFC system. Moreover, it has been found that increasing the AFC system sensitivity to effect an increase in "pull-in" on channel 6 causes a serious "blocking" or "lockout" problem on channel 2. Thus, receivers employing varactor tuners present a special problem insofar as frequency "pull-in" variations with a range of received signal frequencies are concerned.

OBJECTS AND SUMMARY OF THE INVENTION

It is an object of the present invention to provide an enhanced automatic frequency control (AFC) system for a signal receiver. Another object of the invention is to improve the frequency "pull-in" characteristics of a signal receiver employing a varactor type tuner. A further object of the invention is to provide AFC apparatus for altering the "pull-in" range of a varactor tuner system in accordance with selection of received signals.

These and other objects, advantages and capabilities are achieved in one aspect of the invention by an automatic frequency control (AFC) system for a signal receiver having a varactor tuner responsive to adjustments of a potential source for effecting signal frequency selection wherein the gain of a discriminator means and the frequency "pull-in" range of the system is also controlled by the potential adjustments.

PREFERRED EMBODIMENTS OF THE DISCLOSURE

Figure 1:
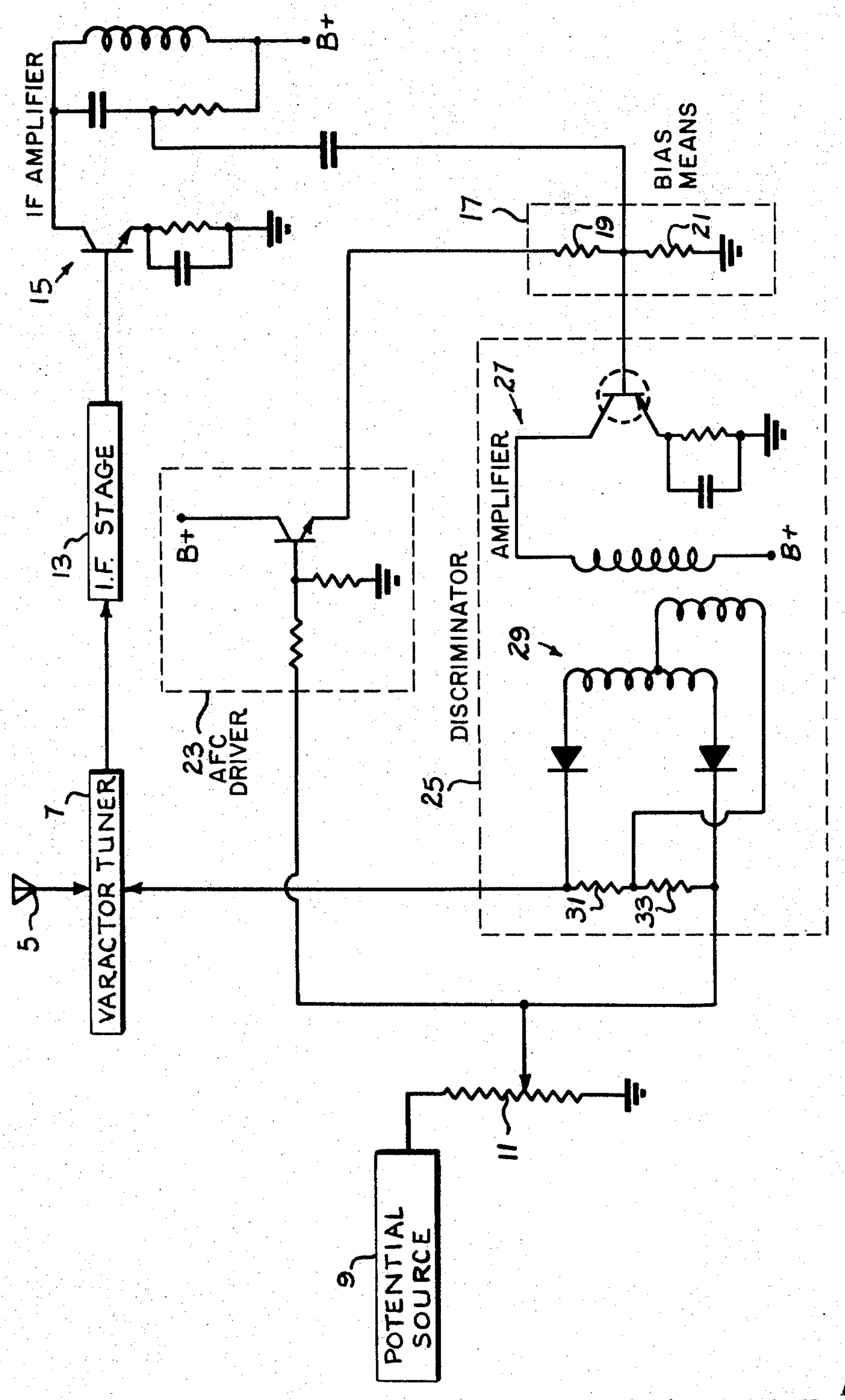
FIG. 1 illustrates, in block and schematic form, a portion of a signal receiver utilizing a varactor tuner and a preferred form of automatic frequency control (AFC) circuitry.

For a better understanding of the present invention, together with other and further objects, advantages and capabilities thereof, reference is made to the following disclosure in conjunction with the accompany drawings and appended claims.

Referring to the drawings, a signal receiver includes an antenna 5 for intercepting transmitted signals and applying these intercepted signals to a varactor tuner 7. The varactor tuner 7 is coupled to a potential source 9 by an adjustable resistor 11 connected intermediate the potential source 9 and a potential reference level such as circuit ground. Thus, adjustment of the resistor 11 varies the potential applied to the varactor tuner 7 for effecting selection of signals at various frequencies.

The varactor tuner 7 provides intermediate frequency (IF) output signals which are applied to a plurality of IF amplifier stages 13 and a final IF amplifier stage 15. The IF amplifier stage 13 and the final IF amplifier stage 15 are tuned to a mean IF value. Deviations of the IF output signal from the varactor tuner 7 from the mean IF value of the IF amplifier stages 13 and 15 are applied to a bias means 17.

The bias means 17 includes a voltage divider in the form of a pair of resistors 19 and 21 series connected intermediate a potential reference level such as circuit ground and via an AFC driver stage 23 to the alterable resistor 11 coupled to the potential source 9. Also, the junction of the series connected resistors 19 and 21 is connected to the final IF amplifier stage 15 and to a discriminator means 25.

The discriminator means 25 includes an amplifier stage 27 coupled to a discriminator stage 29. The amplifier stage 27 is coupled to the junction of the series connected resistors 19 and 21 of the bias means 17 and to the final IF amplifier stage 15. The discriminator stage 29 includes a pair of load resistors 31 and 33 which couples the control arm of the adjustable resistor 11 to the varactor tuner 7.

Figure 2:
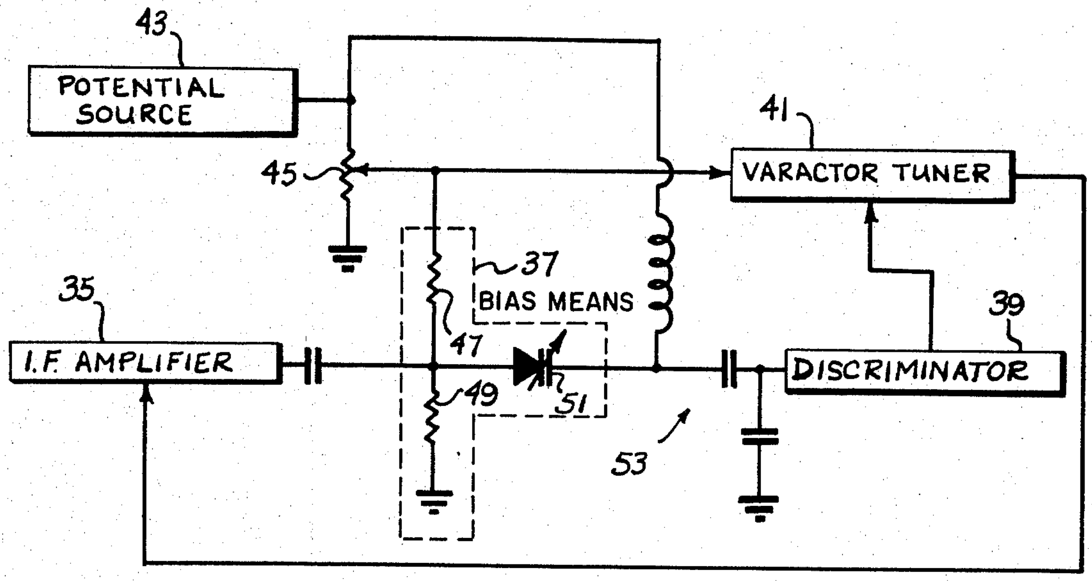
FIG. 2 is an alternative form of AFC circuitry.

In the alternative embodiment of FIG. 2, a final IF amplifier stage 35 is coupled via a bias means 37 to a discriminator means 39. The discriminator means is, in turn, coupled to a varactor tuner 41. Also, a potential source 43 is coupled to an adjustable resistor 45 which is connected to the bias means 37 and to the varactor tuner 41.

Further, the bias means 37 includes a pair of resistors 47 and 49 series connected intermediate the adjustable resistor 45 coupled to the potential source 43 and a potential reference level such as circuit ground. Moreover, a varactor diode 51 couples the final IF amplifier stage 35 and the junction of the series connected resistors 47 and 49 to the discriminator means 39 having an input capacitance represented by the network 53.

Figure 3:
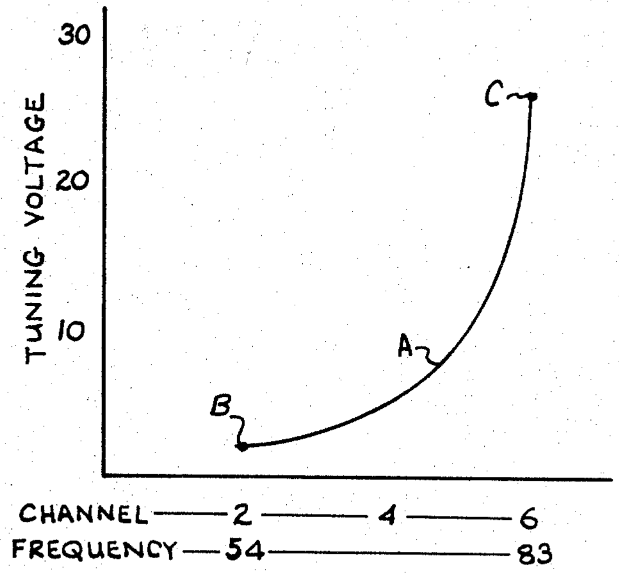
FIG. 3 is a typical illustrative voltage-frequency response curve for a varactor type tuner employed in a signal receiver.

As to operation, FIG. 3 illustrates a non-linear voltage-frequency response curve, curve A, typical of a normal varactor tuner in a signal receiver. As can readily be seen, the response curve, curve A, has a slope of about 3 mHz (Point B) per volt of AFC voltage when tuned to a relatively low frequency such as channel 2 or about 54 mHz. As the tuning reaches a relatively high value, such as channel 6 or about 83 mHz, the response is altered to a slope of about 0.3 mHz (Point C) per volt of AFC voltage. Thus, uncompensated varactor tuners have an undesirably wide ratio of "pull-in" range per volt of applied AFC correction voltage of about 10:1 as tuning is shifted from a relatively low channel, channel 2, to a relatively high channel, channel 6. Moreover, a similar undesirable ratio is encountered in a comparison of channels 7 and 13 and 14 and 83.

One embodiment of apparatus suitable for overcoming the above-mentioned undesirably wide ratio of "-pull-in" range is illustrated in FIG. 1. Therein, application of relatively high and low potentials to effect selection of relatively high and low frequency signals by the varactor tuner 7 is provided by alteration of the adjustable resistor 11. Moreover, the varactor tuner 7 provides a relatively low "pull-in" of about 0.3 mHz per volt of applied AFC voltage at relatively high frequency signals and a relatively high "pull-in" of about 3.0 mHz per volt of applied AFC voltage at relatively low frequency signals. However, the relatively high potential utilized to provide selection of relatively high frequency signals (where there is a relatively low "pull-in" range) is also applied to the bias means 17 via AFC driver stage 23. In this manner, the relatively high potential alters the bias potential applied to the amplifier stage 27 of the discriminator means 25 to effect maximum gain thereof. Thus, maximum amplification of the fixed AFC potential available from the final IF amplifier stage 15 results.

Similarly, a relatively low potential provided by the adjustable potential source 9 provides selection of relatively low frequency signals (where there is a relatively high "pull-in" range). Upon application of the relatively low potential to the bias means 17, the amplifier stage 27 of the discriminator means 25 is reversed biased and a minimum amplification of the fixed AFC potential available from the final IF amplifier stage 15 is provided.

Thus, the AFC circuitry provides maximum amplification of the constant AFC potential on high channels and minimum amplification of the constant AFC potentials on low channels. In this manner, relatively high and undesirably wide ratios of "pull-in", about 10:1, common to uncompensated varactor tuner circuitry is reduced to much narrower ratios of "pull-in", about 3:1, when compensated AFC circuitry is employed in a signal receiver.

Alternatively, the embodiment of FIG. 2 illustrates still another form of compensated AFC circuitry suitable for use with the varactor tuner 41. Herein, deviations of an IF signal from a mean IF frequency are coupled via the varactor diode 51 to the discriminator means 39. Also, the varactor diode 51 is biased in accordance with the setting of the adjustable resistor 45 whereby the signal frequency of the varactor tuner 41 is also selected.

Essentially, variations of the AFC signal available from the IF amplifier stage 35 and applied to the discriminator means 39 are accomplished by varying the reverse bias applied to the varactor diode 51. In turn, the reverse bias applied to the varactor diode 51 alters the magnitude of the capacitance thereof which, in conjunction with the capacitance network 53, alters the AFC signal applied to the discriminator means 39.

For example, adjustment of the alterable resistor 45 to provide a relatively high potential provides application of a relatively small reverse bias voltage across the varactor diode 51. With a small reverse bias voltage, the capacitance of the varactor diode 51 is relatively large and a relatively large portion of the signal available from the IF amplifier stage 35 is applied to the discriminator means 39 to effect application of a relatively large correction potential to the varactor tuner 41. Thus, compensation for the relatively small change in frequency per applied volt of AFC correction at relatively high frequency and tuning voltages is provided.

Similarly, a relatively low potential provided by the alterable resistor 45 provides a relatively large reverse bias voltage across the varactor diode 51. The large reverse bias applied to the varactor diode 51 provides a low capacitance permitting application of only a small portion of the AFC voltage available from the IF amplifier stage 35 to the discriminator means 39. Thus, a small correction potential is applied to the varactor tuner 41 which at low tuning voltages exhibits a relatively large change in frequency per volt of AFC correction.

Thus, relatively simple and inexpensive AFC circuitry for compensation of the relatively wide "pull-in" range common to varactor tuners is provided. Moreover, the circuitry provides an enhanced system having a reliability and dependability believed to be unobtainable in other known forms of circuitry at anywhere near comparable cost.

While there have been shown and described what are at present considered the preferred embodiments of the invention, it will be obvious to those skilled in the art that various changes and modifications may be made therein without departing from the invention as defined by the appended claims.

We claim:

1. In a signal receiver having a varactor tuner coupled to an intermediate frequency (IF) amplifier means, an automatic frequency control (AFC) circuit comprising:

discriminator means coupling said intermediate frequency (IF) amplifier means to said varactor tuner;

bias means coupled to said discriminator means; and an adjustable potential source coupled to said varactor tuner and to said bias means whereby alterations in potential from said source effect selection of relatively high and low frequency signals by said varactor tuner and alteration of said bias means to effect development of relatively high and low AFC correction voltage by said discriminator means and increased and decreased "pull-in" ranges of said varactor tuner.

2. The AFC circuit of claim 1 including an AFC driver stage coupling said adjustable potential source to said bias means.

3. The AFC circuit of claim 1 wherein said bias means is in the form of a voltage divider connected intermediate said adjustable potential source and a potential reference level and coupled to said IF amplifier means and discriminator means.

4. The AFC circuit of claim 1 wherein said bias means includes a pair of resistors series connected intermediate said adjustable potential source and a potential reference level and having a junction intermediate said series connected resistors coupled to said IF amplifier means and said discriminator means.

5. The AFC circuit of claim 1 wherein said bias means includes a voltage divider coupling said adjustable potential source to a potential reference level and a varactor diode coupling said IF amplifier means and voltage divider to said discriminator means.

6. The AFC circuit of claim 1 wherein said discriminator means includes an amplifier stage coupled to said bias means and a discriminator stage coupling said amplifier stage to said varactor tuner.

7. Automatic frequency control (AFC) circuitry for a signal receiver comprising:

a varactor tuner;

intermediate frequency (IF) amplifier means coupled to said tuner;

discriminator means coupling said IF amplifier means to said varactor tuner;

bias means coupled to said discriminator means; and adjustable potential source coupled to said varactor tuner and to said bias means whereby an increase in potential from said source increases the signal frequency selected by said tuner and increases the AFC correction voltage from said discriminator means which increases the "pull-in" range of said varactor tuner.

8. The AFC circuit of claim 7 wherein said bias means is in the form of a voltage divider coupling said adjustable potential source to a potential reference level.

9. The AFC circuit of claim 7 wherein said bias means includes a pair of resistors series connected intermediate said adjustable potential source and a potential reference level with the junction of said series connected resistors coupled to said IF amplifier means and to said discriminator means.

10. The AFC circuitry of claim 7 wherein said bias means includes a voltage divider coupled to said adjustable potential source and to a potential reference level and a varactor diode coupling said voltage divider to said discriminator means.

* * * * *